United States Patent
Schwarzl et al.

(10) Patent No.: US 7,417,736 B2
(45) Date of Patent: Aug. 26, 2008

(54) METHOD FOR DETERMINING A RADIATION POWER AND AN EXPOSURE APPARATUS

(75) Inventors: Siegfried Schwarzl, Neubiberg (DE); Stefan Wurm, Austin, TX (US)

(73) Assignee: Infineon Technologies AG, Neubiberg (DE)

( * ) Notice: Subject to any disclaimer, the term of this patent is extended or adjusted under 35 U.S.C. 154(b) by 127 days.

(21) Appl. No.: 10/599,428

(22) PCT Filed: Mar. 31, 2005

(86) PCT No.: PCT/EP2005/003390
§ 371 (c)(1),
(2), (4) Date: Nov. 6, 2006

(87) PCT Pub. No.: WO2006/102916
PCT Pub. Date: Oct. 5, 2006

(65) Prior Publication Data
US 2008/0037000 A1 Feb. 14, 2008

(51) Int. Cl.
G01J 3/00 (2006.01)
G01J 5/46 (2006.01)
G01N 21/55 (2006.01)
H01L 31/00 (2006.01)

(52) U.S. Cl. .................. 356/445; 356/5.11; 250/214.1; 250/341.1

(58) Field of Classification Search .................. 356/4.1, 356/5.01, 5.09, 5.11–5.13, 445–448, 51, 356/215, 447; 250/241.1, 241 R, 341.1, 250/237
See application file for complete search history.

(56) References Cited

U.S. PATENT DOCUMENTS 4,828,389 A * 5/1989 Gubbins et al. ............. 356/462

(Continued)

FOREIGN PATENT DOCUMENTS

DE 24 46 610 4/1976

(Continued)

*Primary Examiner*—Sang Nguyen
(74) *Attorney, Agent, or Firm*—Dickstein Shapiro LLP (57) ABSTRACT

Method for determining a mean radiation power $$\overline{P^0_{rad}}$$

of electromagnetic radiation of a radiation source, the radiation being intensity-modulated with modulation frequency $\omega_0$, in a predetermined time interval. The method provides a reflector designed to reflect electromagnetic radiation of the radiation source and electromagnetic radiation of a test radiation source, irradiates a predetermined area of the reflector with the source electromagnetic radiation, at least partially irradiates the predetermined area of the reflector with electromagnetic radiation of the test radiation source, measures a $\omega_0$-modulated power component $P_{test,\omega_0}(t)$ of a reflected test radiation power $P_{test}(t)$ of an electromagnetic radiation of the test radiation source, the radiation being reflected from the area, in the predetermined time interval, determines a mean value $$\overline{P^0_{test,\omega_0}}$$

of the measured $\omega_0$-modulated power component $P_{test,\omega_0}(t)$ of the reflected test radiation power $P_{test}(t)$ in the predetermined time interval, and determines the mean radiation power

$$\overline{P^0_{rad}}$$

from the relationship $$\overline{P^0_{rad}} = a \cdot \overline{P^0_{test,\omega_0}},$$

where a is a predetermined constant.

22 Claims, 3 Drawing Sheets

U.S. PATENT DOCUMENTS

| | | | |
|---|---|---|---|
| 4,830,486 A * | 5/1989 | Goodwin | 356/4.09 |
| 5,646,733 A * | 7/1997 | Bieman | 356/604 |
| 6,777,684 B1 * | 8/2004 | Volkov et al. | 250/341.1 |
| 6,825,455 B1 * | 11/2004 | Schwarte | 250/214.1 |
| 2002/0060296 A1 | 5/2002 | Van Der Veen | |
| 2003/0146391 A1 | 8/2003 | Kleinschmidt et al. | |

FOREIGN PATENT DOCUMENTS

| | | |
|---|---|---|
| DE | 29 49 564 C2 | 11/1981 |
| DE | 103 23 664 A1 | 12/2004 |
| EP | 1 017 086 A1 | 7/2000 |
| WO | WO-03/046494 A2 | 6/2003 |

* cited by examiner

METHOD FOR DETERMINING A RADIATION POWER AND AN EXPOSURE APPARATUS

CROSS-REFERENCE TO RELATED APPLICATION

This application is a national phase of International Patent Application Serial No. PCT/EP2005/003390, filed Mar. 31, 2005, and which is incorporated herein by reference in its entirety.

FIELD OF THE INVENTION

The present invention relates to a method for determining a mean radiation power of an electromagnetic radiation of a radiation source, and an exposure apparatus for exposing a material with electromagnetic radiation.

BACKGROUND OF THE INVENTION

Lithography processes constitute a significant process step in the semiconductor industry. In conventional lithographic methods, structures of a mask are transferred in the ratio 1:1 or in demagnified fashion, e.g. in the ratio 4:1, onto a light-sensitive polymer layer (photoresist) that has been applied to an (if appropriate patterned) semiconductor wafer. The wavelength ranges used in this case may lie for example in the visible range, in the DUV (deep ultraviolet) range or in the soft X-ray range, also called EUV (extreme ultraviolet). The photoresists used are often so-called positive resists, which, after exposure with photons of specific wavelengths, become soluble in suitable developers and are thereby removed at the exposed locations during the development process. However, it is also possible for negative resistance to be used, in the case of which unexposed regions of the photoresist are stripped away and exposed regions are retained.

The optimum exposure dose, that is to say the optimum radiation power impinging on the photoresist per unit area over a specific period of time, is of crucial importance in order that the structure transfer from the mask into the photoresist is effected with maximal dimensional fidelity and the resist profiles after development are as steep as possible. Underexposure can lead to incomplete removal of the resist in the exposed regions. The resist sidewalls may slope to shallowly and be unsuitable for a subsequent dimensionally accurate structure transfer from the resist into the underlying layer or the substrate by means of plasma etching or ion implantation. Overexposure can lead to an expansion of the exposed regions and thus to undesirably narrow resist webs.

In the prior art, in order to determine the correct exposure dose for each batch of wafers, a so-called precursor wafer or test wafer is exposed with different doses (exposure gradation), developed and measured for structural accuracy in an inline CD measuring unit. With the "ideal" exposure dose determined therefrom, the wafers of the batch are exposed uniformly. Fluctuations in the resist sensitivity, the mean resist thickness, the resist support, etc. from wafer batch to wafer batch are taken into account in this way. However, the method is time-consuming, lowers the throughput of the exposure unit, which cannot be utilized during the processing of the test wafer, and thereby causes increased costs. This method does not register variations in the resist thickness over the wafer and from wafer to wafer and dose fluctuations which are caused by the exposure unit during the exposure of a batch.

In the case of the conventional optical steppers and scanners in the visible range and in the DUV range, portions of the light are coupled out by means of suitable components, such as, for example, beam splitters, etc., and measured in real time. Using electronic control mechanisms, temporal fluctuations in the exposure power are then compensated for by means of shutters, diaphragms and/or the speed of the scanning tables.

Such beam splitters are not possible in the EUV range since the light absorption of the materials is too great for such components.

SUMMARY OF THE INVENTION

The invention specifies a method which makes it possible to measure the mean radiation power of electromagnetic radiation of a radiation source, in particular in the EUV spectral range, in a predetermined time interval. The invention further provides a corresponding exposure apparatus.

BRIEF DESCRIPTION OF THE DRAWINGS

The present invention is described by way of example below with reference to accompanying drawings of preferred embodiments, in which.

An exposure apparatus of a particularly preferred embodiment of the invention is described by way of example with reference to the figures.

DETAILED DESCRIPTION OF PREFERRED EMBODIMENTS OF THE INVENTION

The present invention comprises a method for determining a mean radiation power $$\overline{P_{rad}^0}$$

of art electromagnetic radiation of a radiation source, the radiation being intensity-modulated with modulation frequency $\omega_0$, in a predetermined time interval $t_0$ to $t_0+\Delta t$, comprising:

providing a reflector device, which is designed to reflect electromagnetic radiation of the radiation source and electromagnetic radiation of a test radiation source;

irradiating a predetermined area of the reflector device with the electromagnetic radiation of the radiation source;

at least partially irradiating the predetermined area of the reflector device with electromagnetic radiation of the test radiation source;

measuring a $\omega_0$-modulated power component $P_{test,\omega_0}(t)$ of a reflected test radiation power $P_{test}(t)$ of an electromagnetic radiation of the test radiation source, the radiation being reflected from the area, in the predetermined time interval;

determining a mean value $$\overline{P^0_{test,\omega_0}}$$

of the measured $\omega_0$-modulated power component $P_{test,\omega_0}(t)$ of the reflected test radiation power $P_{test}(t)$ in the predetermined time interval; and determining the mean radiation power $$\overline{P^0_{rad}}$$

of the electromagnetic radiation of the radiation source from the relationship $$\overline{P^0_{rad}} = a \cdot \overline{P^0_{test,\omega_0}},$$

where a is a predetermined or predeterminable constant.

The method according to the invention is based in particular on the fact that on account of known physical processes, the test radiation power $P_{test}(t)$ of the reflected electromagnetic radiation of the test radiation source, upon reflection from the reflector device, has an intensity or power component $P_{test,\omega_0}(t)$ intensity-modulated with the modulation frequency $\omega_0$ of the radiation source.

The test radiation source of the invention is preferably a constant radiation source, that is to say that the test radiation power or an intensity of the electromagnetic radiation of the test radiation source that is incident on the reflector device is preferably constant.

The intensity modulation of the electromagnetic radiation of the radiation source may be formed for example essentially in sinusoidal fashion or in rectangular fashion. Furthermore, the electromagnetic radiation may be pulsed, for example, or have another essentially periodic profile.

The electromagnetic radiation of the radiation source that is intensity-modulated with the modulation frequency $\omega_0$ generates a modulated temperature profile in the reflector device, in particular in the irradiated region of the reflector device. If the reflector device is a semiconductor, for example, then a modulated electron/hole plasma density is additionally generated. In this case, the temperature profile and, if appropriate, the plasma density profile has the characteristics of a critically damped wave.

If the properties of the reflector device, that is to say for example the composition of the reflector device, comprising one or a plurality of materials are known, that is to say that the reflectivity of the reflector device is known, the reflectivity of the reflector device being essentially constant over the time period of an exposure duration, then the mean power of the electromagnetic radiation incident on the reflector device during the time interval $\Delta t$ is essentially proportional to the mean power component $$\overline{P^0_{test,\omega_0}}$$

—intensity-modulated with modulation frequency $\omega_0$—of the electromagnetic radiation of the test radiation source that is reflected from the reflector device. On account of the modulated temperature profile or the modulated electron/hole plasma density, the reflectivity of the reflector device that is essentially constant over the time period of the exposure duration has a portion that is essentially modulated with the modulation frequency $\omega_0$. Therefore, the test radiation power $P_{test}(t)$ of the reflected electromagnetic radiation of the test radiation source advantageously has a power component $P_{test,\omega_0}(t)$ that is essentially modulated with the modulation frequency $\omega_0$.

If the electromagnetic radiation of the test radiation source which has an essentially constant test radiation power is thus incident on the reflector device, then the radiation is reflected from the reflector device and, on account of the modulated temperature profile or the modulated electron/hole plasma density, the test radiation power $P_{test}(t)$ of the reflected radiation is modulated with the modulated frequency $\omega_0$. If the modulated power component $P_{test,\omega_0}(t)$ of the test radiation power $P_{test}(t)$ is measured, the modulated radiation power $P_{rad}(t)$ of the radiation of the radiation source can be deduced therefrom. Preferably, the modulated power component $P_{test,\omega_0}(t)$ of the test radiation power $P_{test}(t)$ of the reflected radiation is in this case measured not only over one modulation period, for example, but over a multiplicity of modulation periods, for example over 5 to 500 modulation periods, in particular 10 modulation periods. On the basis of the above relationship, the mean value of the modulated power component $$\overline{P^0_{test,\omega_0}}$$

of the test radiation power $P_{test}(t)$ of the reflected radiation of the test radiation source over 10 modulation periods, for example, yields the mean radiation power $$\overline{P^0_{rad}}$$

of the radiation source during the 10 modulation periods, for example.

If, by way of example, the mean radiation power $$\overline{P^0_{rad}}$$

of the radiation source is determined for one modulation period, then the time interval $\Delta t$ essentially corresponds to the duration of one modulation period. If the mean radiation power $$\overline{P^0_{rad}}$$

of the radiation source is determined for example for a multiplicity of modulation periods, for example 10 modulation periods, then the time interval $\Delta t$ essentially corresponds to the duration of the 10 modulation periods.

The mean radiation power $$\overline{P_{rad}^0}$$

of the radiation source in the time interval $t_0$ to $t_0+\Delta t$ can be determined for example on the basis of the relationship:

$$\overline{P_{rad}^0} = \frac{1}{\Delta t}\int_{t_0}^{t_0+\Delta t} P_{rad}(t)\,dt$$

where $P_{rad}(t)$ represents the intensity-modulated radiation power of the radiation source at the instant t. Since the intensity-modulated radiation power $P_{rad}(t)$ of the radiation source is furthermore proportional to the power component $P_{test,\omega_0}(t)$—modulated with the modulation frequency $\omega_0$—of the reflected test radiation power $P_{test}(t)$ of the test radiation source, the power $P_{rad}(t)$ of the radiation source can be determined from the power component $P_{test,\omega_0}(t)$—modulated with the modulation frequency $\omega_0$—of the reflected test radiation power $P_{test}(t)$. The mean radiation power $$\overline{P_{rad}^0}$$

of the radiation source can equally be determined from the mean power component $$\overline{P_{test,\omega_0}^0}$$

—modulated with the modulation frequency $\omega_0$—of the reflected test radiation power $P_{test}(t)$ in the time interval $t_0$ to $t_0+\Delta t$. Furthermore, it is possible to determine the mean radiation power $$\overline{P_{rad}^0}$$

of the radiation source on the basis of a different relationship than the one mentioned above, in order e.g. to reduce influences due to noise or to achieve a specific normalization.

The time interval $\Delta t$ is preferably small relative to the exposure duration. In the case of a preferably pulsed radiation source, the time interval $\Delta t$ comprises a multiplicity of pulses of the preferably pulsed radiation source, for example 5 to 100 pulses, in particular 10 pulses.

The proportionality constant a can be determined for example with the aid of the test wafer and the absolute value of the mean radiation power $$\overline{P_{rad}^0}$$

in watts can thus be calculated from the measured mean intensity-modulated reflected test radiation power $$\overline{P_{test,\omega_0}^0}.$$

Furthermore, it is possible, for example, for the proportionality constant a to be chosen in such a way that the mean radiation power $$\overline{P_{rad}^0}$$

per area, that is to say for example in watt/m², is measured. However, it is also possible for the proportionality constant a to be chosen in such a way that the mean radiation power $$\overline{P_{rad}^0}$$

of the radiation source is specified in an arbitrary unit. This may be advantageous in particular if only the relative change in the mean radiation power $$\overline{P_{rad}^0}$$

of the radiation source is of interest.

In a further preferred embodiment, the proportionality constant a may be chosen in such a way that it is possible to calculate the mean radiation energy of the electromagnetic radiation of the radiation source per area.

The method of the present invention therefore advantageously makes it possible to determine the mean radiation intensity of the radiation of the radiation source that impinges on the reflector device in the time interval to $t_0$ to $t_0+\Delta t$. The radiation may for example be reflected from the reflector device and irradiates for example an area of a material to be patterned, such as e.g. an area of a photoresist. Given a known reflectivity of the reflector device, the mean intensity of the radiation radiated onto the area of the material to be patterned can essentially be determined from the mean intensity of the radiation of the radiation source that impinges on the area of the reflector device.

The method according to the invention is preferably used for determining radiation power in the case of an EUV exposure, the EUV spectral range preferably encompassing electromagnetic radiation in a wavelength range of 5 nm to 20 nm.

Consequently, by way of example, in the exposure of a photoresist with EUV radiation of an EUV exposure unit, the mean radiation power of the EUV radiation impinging on the photoresist can be determined by determining the mean radiation power $$\overline{P_{rad}^0}$$

of the radiation which is radiated for example onto the area of the reflector device of the EUV exposure unit.

In particular, it is also possible to ascertain whether, by way of example, the actual mean radiation power $$\overline{P_{rad}^0}$$

in the time interval $t_0$ to $t_0+\Delta t$ matches a desired radiation power $P_{rad}^{desired}$, the desired radiation power $P_{rad}^{desired}$ being for example a predetermined radiation power which is desired or necessary for the exact exposure of a photoresist. One preferred embodiment variant of the method of the invention further includes:

regulating an output power of the radiation source in such a way that a difference between a mean radiation power $$\overline{P_{rad}^1}$$

of electromagnetic radiation of the radiation source in a time interval $t_1$ to $t_1+\Delta t$ and a desired radiation power $P_{rad}^{desired}$ is essentially minimized, where $t_1 > t_0+\Delta t$ holds true.

In particular, it is thereby possible to ascertain fluctuations in the radiation power of the radiation source which are caused for example by a malfunction of the radiation source. Furthermore, it is possible for the output power of the radiation source to be adapted in each case to these fluctuations and, consequently, by way of example, an incorrect exposure of a photoresist can be avoided. The fluctuations in the mean radiation power may be measured in an absolute unit, for example in watts. However, it is also possible for relative fluctuations in the radiation power to be measured and for these relative fluctuations to be compensated for or readjusted in each case depending on the measurements.

In other words, the difference between the desired radiation power $P_{rad}^{desired}$ and the radiation power $$\overline{P_{rad}^0}$$

is taken as a basis for determining whether and, if appropriate, how the output power of the electromagnetic radiation of the radiation source must be regulated, so that the difference between the mean radiation power $$\overline{P_{rad}^1}$$

and the desired radiation power $P_{rad}^{desired}$ is essentially minimized. Consequently, essentially the deviation of the mean radiation power $$\overline{P_{rad}^0}$$

from the desired radiation power $P_{rad}^{desired}$ in a first time interval of $t_0$ to $t_0+\Delta t$ is determined and this deviation is used to regulate the output power of the radiation source, so that in a next time interval of $t_1$ to $t_1+\Delta t$ the radiation power $$\overline{P_{rad}^0}$$

determined essentially corresponds to the desired radiation power $P_{rad}^{desired}$.

In a further preferred embodiment variant of the present invention, the method steps are carried out repeatedly in the order specified.

This enables the radiation power of the radiation source to be measured and regulated over a long period of time, that is to say over a multiplicity of preferably successive time intervals $\Delta t$. The method is therefore particularly suitable for use for the industrial fabrication for example of semiconductor components by means of an EUV exposure device, such as an EUV lithography device, since, by way of example, the radiation power of the radiation source can be determined, monitored and regulated in one or a multiplicity of method steps preceding one after another.

In one particularly preferred embodiment variant of the invention, the predetermined time interval $\Delta t$ is essentially equal to 0.1 ms to 10 ms, in particular 1 ms.

On account of the small magnitude of the predetermined time interval $\Delta t$, in particular in comparison with a customarily used exposure time of essentially 0.1 s to 1 s, the mean radiation power of the radiation source essentially corresponds to the actual instantaneous radiation power, so that the actual instantaneous radiation power is approximately constant in the time interval $\Delta t$. The radiation source is particularly preferably an EUV radiation source which emits electromagnetic radiation in a wavelength range of preferably 5 nm to 20 nm.

The EUV radiation source is particularly preferably a pulsed EUV radiation source have a pulse duration of preferably 10 ns to 500 ns.

The test radiation source is preferably an He—Ne laser or a semiconductor laser.

However, the test radiation source may also be a different type of radiation source, a radiation source whose radiation power can be determined as accurately as possible or whose reflected radiation power can be measured as accurately as possible preferably being selected.

In a further preferred embodiment variant of the invention, a beam direction of the radiation source and a beam direction of the test radiation source are arranged at an angle with respect to one another.

In one particularly preferred embodiment variant, the angle is essentially 0°.

Further optical apparatuses, such as e.g. a λ/4 plate, are preferably inserted into the beam path of the test radiation source, so that the incident beam can be differentiated from the reflected beam of the test radiation source.

In a further particularly preferred embodiment variant, the angle preferably lies between 0° and 90°, that is to say between perpendicular and virtually glancing incidence, particularly preferably between 30° and 70°.

Furthermore, the present invention provides an exposure apparatus for exposing a material with electromagnetic radiation, comprising:

a radiation source, which is designed to generate an electromagnetic radiation intensity-modulated with modulation frequency $\omega_0$;

a test radiation source, which is designed to generate electromagnetic radiation;

a reflector device, which is designed to reflect both the electromagnetic radiation of the radiation source and the electromagnetic radiation of the test radiation source;

a measuring device, which is designed for measuring a $\omega_0$-modulated power component $P_{test,\omega_0}(t)$ of a reflected test radiation power $P_{test}(t)$ of an electromagnetic radiation of the test radiation source, the radiation being reflected from the reflector device; and a determining device, which is designed to determine a mean value $$\overline{P^0_{test,\omega_0}}$$

of the measured $\omega_0$-modulated power component $P_{test,\omega_0}(t)$ of the reflected test radiation power $P_{test}(t)$ in the predetermined time interval and to determine the mean radiation power $$\overline{P^0_{rad}}$$

of the electromagnetic radiation of the radiation source from the relationship $$\overline{P^0_{rad}} = a \cdot \overline{P^0_{test,\omega_0}}$$

where a is a predetermined or predeterminable constant.

Analogously to the above-described method according to the invention, the exposure apparatus of the invention can be used to determine, during the exposure of a material, the mean radiation power $$\overline{P^0_{rad}}$$

in a time interval $t_0$ to $t_0+\Delta t$ of the electromagnetic radiation $P_{rad}(t)$ of the radiation source that impinges on the reflector device. Consequently, it is also possible to determine the mean radiation power $$\overline{P^0_{rad}}$$

of the electromagnetic radiation impinging on the material.

In particular, the proportionality constant a may be chosen in such a way that the mean radiation power $$\overline{P^0_{rad}}$$

can be determined as an absolute value, for example in watts, or as a relative value. However, the mean radiation power can also be normalized to the size of the irradiated area.

In particular, it is thereby possible to compare the mean radiation power $$\overline{P^0_{rad}}$$

in the time interval of $t_0$ to $t_0+\Delta t$ with a desired radiation power $P_{rad}^{desired}$. In this case, the desired radiation power $P_{rad}^{desired}$ may essentially represent the power required for the exposure of the material and deviations of the radiation power of the radiation source can easily be detected, and if appropriate compensated for, by comparing the measured value with the desired radiation value $P_{rad}^{desired}$. In this case, such deviations may be determined both in absolute values and as relative deviations.

One preferred embodiment of the exposure apparatus of the invention furthermore comprises a regulating device, which is designed for regulating an output power of the electromagnetic radiation of the radiation source, in such a way that a difference between a mean radiation power $$\overline{P^1_{rad}}$$

of electromagnetic radiation of the radiation source in the time interval $t_1$ to $t_1+\Delta t$ and a desired radiation power $P_{rad}^{desired}$ is essentially minimized, where $t_1 > t_0+\Delta t$ holds true.

In particular, it is thereby possible to ascertain fluctuations in the radiation power of the radiation source which are caused for example by a malfunction of the radiation source. In this connection, reference is made to the above explanations concerning the method according to the invention.

In a further preferred embodiment of the exposure apparatus according to the invention, the radiation source is preferably an EUV radiation source, that is to say a radiation source having an electromagnetic radiation in a wavelength of 5 nm to 20 nm.

The EUV radiation source is particularly preferably a pulsed EUV radiation source having a pulse duration of preferably 10 ns to 500 ns and repetition rates of preferably 1 kHz to 10 kHz.

The reflector device of the exposure apparatus of the present invention may be for example part of a stepper/scanner of an EUV lithography exposure apparatus such as can be used in the semiconductor industry. In a further preferred embodiment of the exposure apparatus according to the invention, the exposure apparatus is an EUV lithography exposure apparatus.

In one particularly preferred embodiment of the exposure apparatus according to the invention, the predetermined time interval is 0.1 ms to 10 ms, in particular 1 ms.

On account of the small magnitude of the predetermined time interval $\Delta t$, in particular in comparison with a customarily used exposure time of essentially 0.1 s to 1 s, the mean radiation power of the radiation source essentially corresponds to the actual instantaneous radiation power.

The test radiation source of the exposure apparatus according to the invention is preferably a He—Ne laser or a semiconductor laser.

However, the test radiation source may also be a different radiation source, a radiation source whose radiation power can be determined as accurately as possible preferably being selected.

In a further preferred embodiment of the invention, a beam direction of the radiation source and a beam direction of the test radiation source are arranged at an angle with respect to one another.

Particularly preferably, the angle is essentially 0°.

Further optical apparatuses such as e.g. λ/4 plate, are preferably also inserted into the beam path of the test radiation source, so that the incident beam can be differentiated from the reflected beam of the test radiation source.

The angle furthermore particularly preferably lies between 0° (essentially perpendicular incidence) and 90° (essentially glancing incidence), particularly preferably between 30° and 70°.

Figure 1:
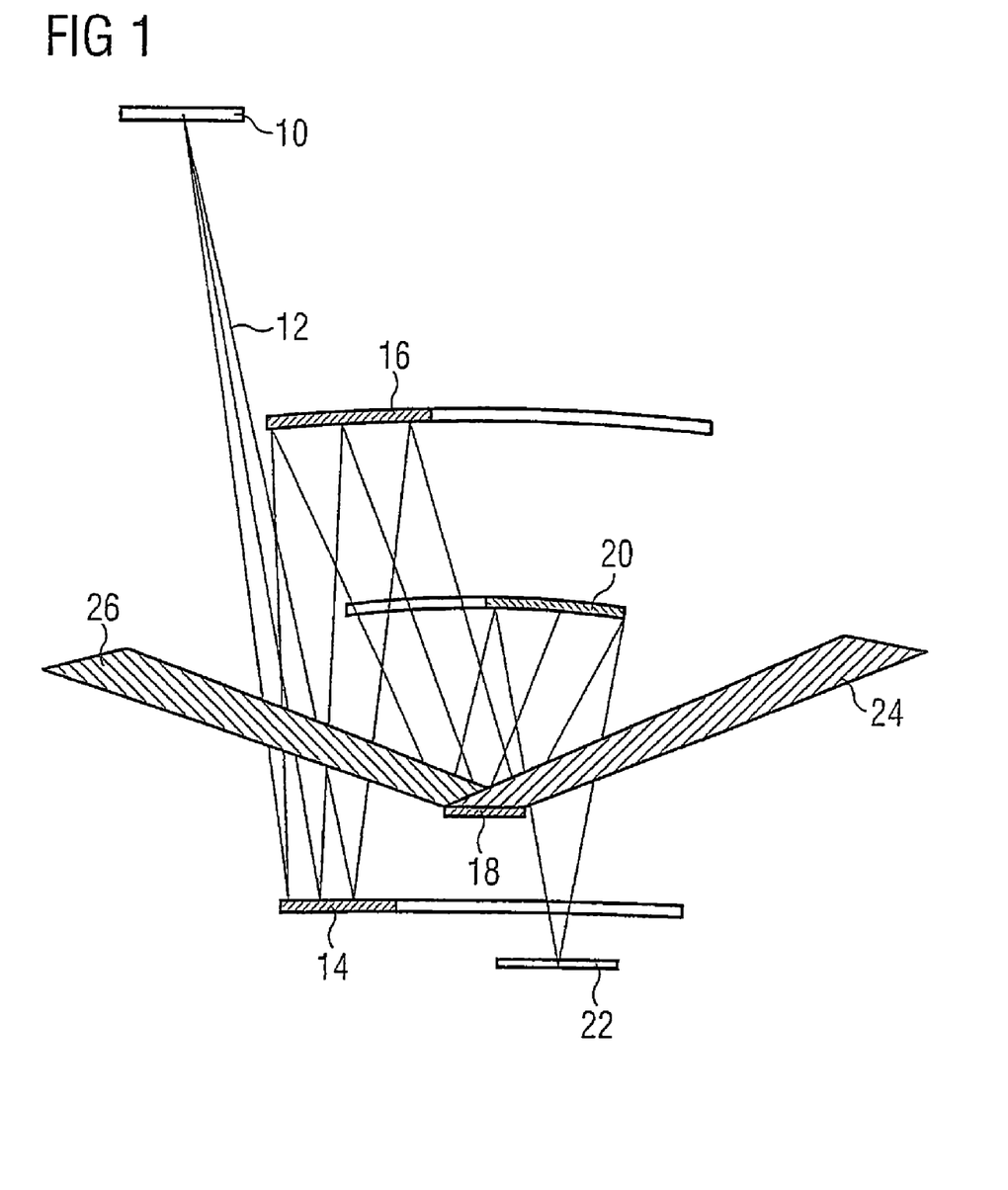
FIG. 1 shows a schematic view of an exposure apparatus in accordance with a preferred embodiment of the present invention.

FIG. 1 shows, in a schematic sectional view, an electromagnetic radiation 12 of a radiation source (not shown) that is reflected from a mask 10. The electromagnetic radiation 12 impinges on a first, second, third and fourth reflector device 14, 16, 18 and 20 before it is incident on a material 22 to be exposed. In this case, the structure of the mask 10 is transferred to the material 22 to be exposed for example by transillumination of the mask or reflection of the electromagnetic radiation from the mask. In the present preferred embodiment, the third reflector device 18 is completely irradiated by the electromagnetic radiation 12. An incident electromagnetic radiation 24 of a test radiation source (shown in FIG. 2) is furthermore shown. The incident electromagnetic radiation 24 of the test radiation source irradiates essentially the same area of the third reflector device 18 which is also irradiated by the electromagnetic radiation 12 of the radiation source. The reflected test radiation power of an electromagnetic radiation 26 of the test radiation source that is reflected from the third reflector device 18 can be measured by a measuring device (shown in FIG. 2).

Since reflectivities of the respective reflector devices 14, 16, 18 and 20 essentially do not change during an exposure duration, the radiation power $P_{rad}(t)$ of the electromagnetic radiation radiated onto the third reflector device 18 is essentially proportional to the measured power component $P_{test,\omega_0}(t)$—modulated with modulation frequency $\omega_0$—of the reflected test radiation power $P_{test}(t)$ of the reflected electromagnetic radiation 26 of the test radiation source. If it is furthermore assumed that the reflectivity of the fourth reflector device 20 and a transmissivity of a medium (not shown) between the third and fourth reflector devices 18, 20 and a transmissivity of a medium (not shown) between the fourth reflector device 20 and the material 22 to be exposed are known and these reflectivities and transmissivities in each case do not change essentially over the time period of the exposure duration, then the mean radiation power $$\overline{P^0_{rad}}$$

of the electromagnetic radiation 12 impinging on the material 22 to be exposed can be determined from the measured mean power component $$\overline{P^0_{test,\omega_0}}$$

—modulated with modulation frequency $\omega_0$—of the reflected test power $P_{test}(t)$ of the reflected electromagnetic radiation 26.

In particular, it is also possible to determine a proportionality constant with a test material, such as e.g. a test wafer (not shown) so that it is possible to determine both the absolute radiation power and the relative radiation power of the electromagnetic radiation 12 impinging on the material 22 to be exposed. In particular, it is possible, by progressively determining the radiation power $P_{rad}(t)$ of the electromagnetic radiation 12 impinging on the material 22 to be exposed, to ascertain fluctuations in a power output or an output power of the radiation source and to regulate them such that the fluctuations are compensated for. Furthermore, it is possible for the radiation power $P_{rad}(t)$ of the electromagnetic radiation 12 impinging on the material 22 to be exposed to be adapted to a required desired value.

Figure 2:
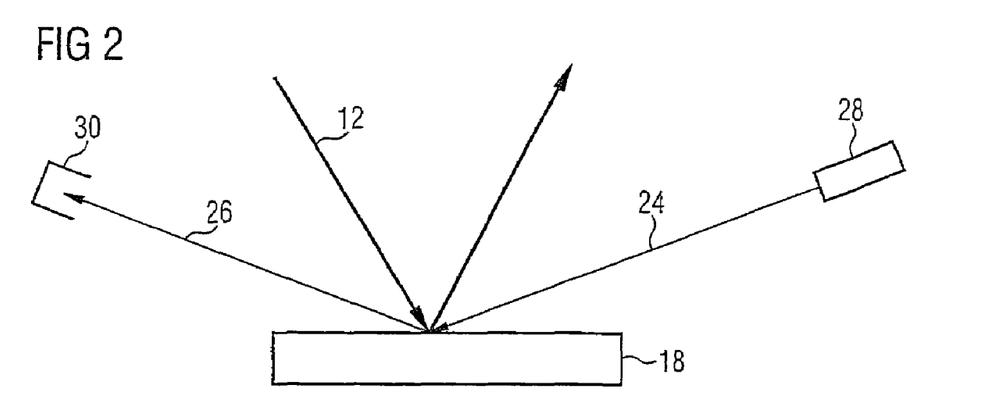
FIG. 2 shows a detail view of the embodiment of FIG. 1.

FIG. 2 shows a schematically illustrated detail from the sectional view of FIG. 1 with the third reflector device 18. The schematic illustration furthermore shows the electromagnetic radiation 12, which modulates a temperature profile in the third reflector device 18, the incident and reflected electromagnetic radiation 24, 26, a test radiation source 28 and a measuring unit 30 for measuring the power component $P_{test,\omega_0}(t)$—modulated with modulation frequency $\omega_0$—of the test radiation power $P_{test}(t)$ of the reflected radiation 26.

The incident electromagnetic radiation 24 of the test radiation source 28 is reflected from the third reflector device 18. The test radiation power $P_{test}(t)$ of the reflected radiation 26 is measured by a measuring device 30, the measuring device 30 being designed so as to measure the power component $P_{test,\omega_0}(t)$—modulated with modulation frequency $\omega_0$—of the test radiation power $P_{test}(t)$ of the reflected radiation 26. On the basis of the modulated power component $P_{test,\omega_0}(t)$ and the mean modulated power component $$\overline{P^0_{test,\omega_0}}$$

of the test radiation power of the reflected radiation 26, it is possible to determine the power $P_{rad}(t)$ and the mean power $$\overline{P^0_{rad}},$$

respectively, of the radiation source.

Figure 3:
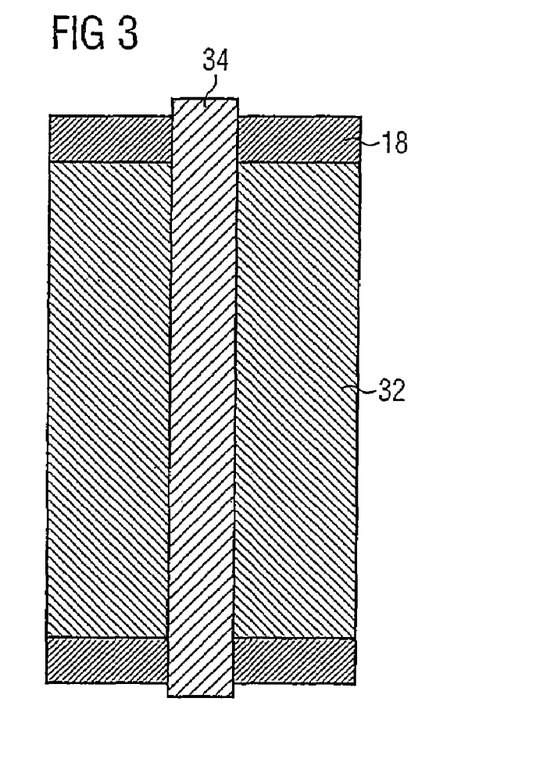
FIG. 3 shows a plan view of a reflector device of a preferred embodiment of the present invention.

FIG. 3 shows a plan view of the third reflector device 18 with an area 32, on which the electromagnetic radiation 12 of the radiation source (not shown) impinges. Furthermore, an area 34 is shown, on which the incident electromagnetic radiation 24 of the test radiation source (not shown) impinges, and is also reflected therefrom. As can be seen from FIG. 3, the area 32 irradiated by the electromagnetic radiation 12 does not correspond to the complete area of the third reflector device 18, but rather only a part thereof. Furthermore, the area 34 of the third reflector device 18 that is irradiated by the incident electromagnetic radiation 24 of the test radiation source corresponds neither to the entire area of the third reflector device 18 nor to the area 32 which is irradiated by the electromagnetic radiation 12. Therefore, it is necessary, in order to determine the mean radiation power of the electromagnetic radiation 12 of the radiation source, to incorporate the area ratios of the area 32 irradiated by the electromagnetic radiation 12 and the area 34 irradiated by the incident electromagnetic radiation 24 of the test radiation source, and also a common area which is irradiated both by the electromagnetic radiation 12 and by the incident electromagnetic radiation 24, into the calculation of the mean radiation power of the electromagnetic radiation 12.

Figure 4A:
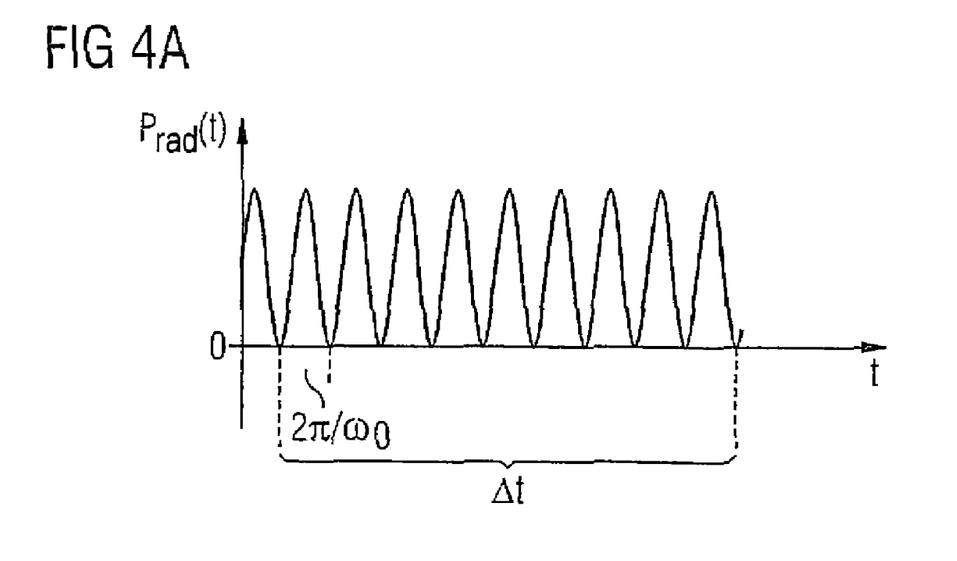
FIG. 4a shows an exemplary temporal profile of a radiation power $P_{rad}(t)$ of an intensity-modulated electromagnetic radiation of a radiation source.

FIG. 4a shows an exemplary profile of the radiation power $P_{rad}(t)$—modulated with modulation frequency $\omega_0$—of the radiation source 12 as a function of the time t. Furthermore, in the embodiment variant of FIG. 4a, the time interval $\Delta t$ essentially comprises 9 modulation periods.

Figure 4B:
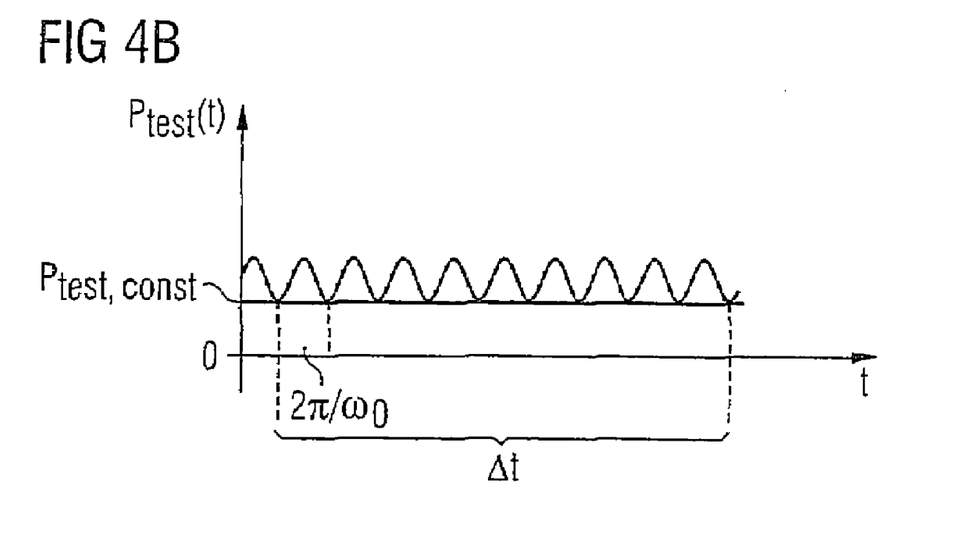
FIG. 4b shows an exemplary temporal profile of a test radiation power $P_{test}(t)$ of a reflected electromagnetic radiation of a test radiation source.

FIG. 4b shows a profile of the test radiation power $P_{test}(t)$ of the reflected test radiation 26 of the test radiation source 28 as a function of the time t. FIG. 4b illustrates the essentially constant test radiation power $P_{test,const}$ of the incident radiation 24 of the test radiation source 28, which, after reflection from the third reflector device 18, is intensity- or power-modulated essentially with the modulation frequency $\omega_0$ as a result of the modulated temperature profile or the modulated electron/hole plasma density in the third reflector device 18. If the profile (FIG. 4a) of the radiation power $P_{rad}(t)$ of the radiation source changes, then the temperature profile or the profile of the electron/hole plasma density in the third reflector device 18 also changes. The altered temperature profile or the altered profile of the electron/hole plasma density influences the reflectivity of the third reflector device 18, as a result of which the profile of the modulated power component $P_{test,\omega_0}(t)$ of the reflected test radiation power $P_{test}(t)$ of the radiation 26 of the test radiation source 28 changes. This change in the modulated power component $P_{test,\omega_0}(t)$ of the reflected test radiation power $P_{test}(t)$ of the radiation 26 can be measured by the measuring device 30 and, consequently, it is possible to determine the radiation power $P_{rad}(t)$ on account of the relationship between the power component $P_{test,\omega_0}(t)$—modulated with modulation frequency $\omega_0$—of the reflected test radiation power $P_{test}(t)$ and the radiation power $P_{rad}(t)$. Analogously to FIG. 4a, the time interval $\Delta t$ essentially comprises 9 modulation periods.

The invention is not restricted to the embodiments described by way of example above. Rather, the arrangement of the reflector devices or the number of reflector devices may vary. Thus, instead of the four reflector devices described above, it is also possible for example to use six, eight or some other number of reflector devices. Accordingly, for the invention it is not necessary for the test beam to impinge on the third reflector device and to be reflected from the latter. Rather, the test beam may also impinge on the first, second or fourth reflector device. Given a larger number of reflector devices, the test beam may correspondingly also impinge on an arbitrary other reflector device.

The invention claimed is:

1. A method for determining a mean radiation power $$\overline{P_{rad}^0}$$

of an electromagnetic radiation of a radiation source, the radiation being intensity-modulated with modulation frequency $\omega_0$, in a predetermined time interval $t_0$ to $t_0+\Delta t$, comprising:

providing a reflector, which is designed to reflect electromagnetic radiation of the radiation source and electromagnetic radiation of a test radiation source;

irradiating a predetermined area of the reflector with the electromagnetic radiation of the radiation source;

at least partially irradiating the predetermined area of the reflector with electromagnetic radiation of the test radiation source;

measuring a $\omega_0$-modulated power component $P_{test,\omega_0}(t)$ of a reflected test radiation power $P_{test}(t)$ of an electromagnetic radiation of the test radiation source, the radiation being reflected from the area, in the predetermined time interval;

determining a mean value $$\overline{P_{test,\omega_0}^0}$$

of the measured $\omega_0$-modulated power component $P_{test,\omega_0}(t)$ of the reflected test radiation power $P_{test}(t)$ in the predetermined time interval; and determining the mean radiation power $$\overline{P_{rad}^0}$$

from the relationship $$\overline{P_{rad}^0} = a \cdot \overline{P_{test,\omega_0}^0},$$

where a is a predetermined or predeterminable constant.

2. The method as claimed in claim 1, further comprising regulating an output power of the radiation source such that a difference between a mean radiation power $$\overline{P_{rad}^1}$$

of electromagnetic radiation of the radiation source in a time interval $t_1$ to $t_1+\Delta t$ and a desired radiation power $P_{rad}^{desired}$ is essentially minimized, where $t_1 > t_0+\Delta t$ holds true.

3. The method as claimed in claim 1, wherein the method steps are carried out repeatedly in the order specified.

4. The method as claimed in claim 1, wherein the predetermined time interval has a magnitude of 0.1 ms to 10 ms.

5. The method as claimed in claim 1, wherein the predetermined time interval has a magnitude of 1 ms.

6. The method as claimed in claim 1, wherein the radiation source is an EUV radiation source.

7. The method as claimed in claim 1, wherein the test radiation source is an He—Ne laser or a semiconductor laser having an essentially constant test radiation power.

8. The method as claimed in claim 1, wherein a beam direction of the radiation source and a beam direction of the test radiation source are arranged at an angle with respect to one another.

9. The method as claimed in claim 8, wherein the angle is essentially 0°.

10. The method as claimed in claim 9, wherein the angle is between essentially 0° and essentially 90°.

11. The method as claimed in claim 9, wherein the angle is between 30° and 70°.

12. An exposure apparatus for exposing a material with electromagnetic radiation, comprising:

a radiation source, which is designed to generate an electromagnetic radiation intensity-modulated with modulation frequency $\omega_0$;

a test radiation source, which is designed to generate electromagnetic radiation;

a reflector, which is designed to reflect both the electromagnetic radiation of the radiation source and the electromagnetic radiation of the test radiation source;

a measuring device, which is designed to measure a $\omega_0$-modulated power component $P_{test,\omega_0}(t)$ of a reflected test radiation power $P_{test}(t)$ of an electromagnetic radiation of the test radiation source, the radiation being reflected from the reflector; and a determining device, which is designed to determine a mean value $$\overline{P^0_{test,\omega_0}}$$

of the measured $\omega_0$-modulated power component $P_{test,\omega_0}(t)$ of the reflected test radiation power $P_{test}(t)$ in a predetermined time interval and to determine the mean radiation power $$\overline{P^0_{rad}}$$

from the relationship $$\overline{P^0_{rad}} = a \cdot \overline{P^0_{test,\omega_0}},$$

where a is a predetermined or predeterminable constant.

13. The exposure apparatus as claimed in claim 12, further comprising a regulating device, which is designed to regulate an output power of the electromagnetic radiation of the radiation source, such that a difference between a mean radiation power $$\overline{P^1_{rad}}$$

of electromagnetic radiation of the radiation source in a time interval $t_1$ to $t_1+\Delta t$ and a desired radiation power $P_{rad}^{desired}$ is essentially minimized, where $t_1 > t_0 + \Delta t$ holds true.

14. The exposure apparatus as claimed in claim 12, wherein an EUV lithography exposure apparatus is involved.

15. The exposure apparatus as claimed in claim 12, wherein the predetermined time interval has a magnitude of 0.1 ms to 10 ms.

16. The exposure apparatus as claimed in claim 12, wherein the predetermined time interval has a magnitude of 1 ms.

17. The exposure apparatus as claimed in claim 12, wherein the test radiation source is an He—Ne laser or a semiconductor laser designed to emit radiation having an essentially constant test radiation power.

18. The exposure apparatus as claimed in claim 12, wherein a beam direction of the radiation source and a beam direction of the test radiation source are arranged at an angle with respect to one another.

19. The exposure apparatus as claimed in claim 18, wherein the angle is essentially 0°.

20. The exposure apparatus as claimed in claim 18, wherein the angle is between essentially 0° and essentially 90°.

21. The exposure apparatus as claimed in claim 18, wherein the angle is between 30° and 70°.

22. An exposure apparatus for exposing a material with electromagnetic radiation, comprising:

a radiation generating means for generating an electromagnetic radiation intensity-modulated with modulation frequency $\omega_0$;

a test radiation generating means for generating electromagnetic radiation;

a reflecting means for reflecting both the electromagnetic radiation of the radiation generating means and the electromagnetic radiation of the test radiation generating means;

a measuring means for measuring a $\omega_0$-modulated power component $P_{test,\omega_0}(t)$ of a reflected test radiation power $P_{test}(t)$ of an electromagnetic radiation of the test radiation generating means, the radiation being reflected from the reflecting means; and a determining means for determining a mean value $$\overline{P^0_{test,\omega_0}}$$

or the measured $\omega_0$-modulated power component $P_{test,\omega_0}(t)$ of the reflected test radiation power $P_{test}(t)$ in a predetermined time interval and for determining the mean radiation power $$\overline{P^0_{rad}}$$

from the relationship $$\overline{P^0_{rad}} = a \cdot \overline{P^0_{test,\omega_0}},$$

where a is a predetermined or predeterminable constant.

* * * * *